United States Patent [19]

Mao

[11] Patent Number: 4,493,056

[45] Date of Patent: Jan. 8, 1985

[54] RAM UTILIZING OFFSET CONTACT REGIONS FOR INCREASED STORAGE CAPACITANCE

[75] Inventor: Robert S. Mao, Hopewell Junction, N.Y.

[73] Assignee: International Business Machines Corporation, Armonk, N.Y.

[21] Appl. No.: 394,055

[22] Filed: Jun. 30, 1982

[51] Int. Cl.³ .................. G11C 11/24; G11C 11/40
[52] U.S. Cl. .................................. 365/149; 357/41; 357/45
[58] Field of Search ............... 365/149, 205, 208, 210; 357/41, 45

[56] References Cited

U.S. PATENT DOCUMENTS

| | | | |
|---|---|---|---|
| 3,387,286 | 6/1968 | Dennard . | |
| 3,740,731 | 6/1973 | Ohwada et al. | 357/14 |
| 3,893,146 | 7/1975 | Heeren | 365/149 |
| 4,031,522 | 6/1977 | Reed et al. | 365/149 |
| 4,044,340 | 8/1977 | Itoh | 365/208 |
| 4,061,999 | 12/1977 | Proebsting et al. | 365/205 |
| 4,095,251 | 6/1978 | Dennard | 357/45 |
| 4,125,878 | 11/1978 | Watanabe | 365/208 |
| 4,138,740 | 3/1979 | Itoh | 365/210 |
| 4,262,341 | 4/1981 | Mogi et al. | 365/205 |
| 4,301,519 | 11/1981 | Lee | 365/210 |
| 4,319,342 | 3/1982 | Scheuerlein . | |
| 4,368,529 | 1/1983 | Furuyama | 365/208 |

OTHER PUBLICATIONS

IBM-TDB, vol. 24, No. 10, Mar. 1982, pp. 5165–5166, "Dummy Word Decoder", R. S. Mao et al.

Primary Examiner—Stuart N. Hecker
Assistant Examiner—Glenn Gossage
Attorney, Agent, or Firm—Douglas A. Lashmit; John A. Jordan; Theodore E. Galanthay

[57] ABSTRACT

An integrated circuit electronic memory array having a plurality of FET memory cells arranged in rows and columns and formed on the same integrated circuit chip with associated support circuits. Each memory cell of the array has a capacitive storage region, an adjacent channel region, and a gate region for controlling the transfer of binary information through the channel region into and out of the capacitive storage region. Each memory cell also includes an offset contact region which contacts an adjacent bit line. The word lines are arranged in rows and the bit lines are arranged in columns, complementary pairs of bit lines being electrically connected to alternate ones of memory cells along each column. A bit line to diffusion capacitance couples each memory cell to the one of the pair of bit lines to which it is electrically not connected. This capacitance boosts the electrical signal written into and read out from the storage capacitor. Also disclosed is a memory array in which a single sense amplifier and dummy cell arrangement placed near the middle of each column of cells selectively accesses either half of the column.

6 Claims, 5 Drawing Figures

RAM UTILIZING OFFSET CONTACT REGIONS FOR INCREASED STORAGE CAPACITANCE

TECHNICAL FIELD

This invention relates to an integrated circuit electronic memory array having a plurality of improved one device memory cells and an advantageous arrangement of such cells in a memory array.

BACKGROUND ART

Integrated circuit electronic memory arrays having a plurality of one device FET memory cells are notoriously well known in the art. Such an array of memory cells was first proposed in Dennard U.S. Pat. No. 3,387,286 entitled: "Field-Effect Transistor Memory". Subsequently, various improvements were made primarily in the fabrication processes, layout techniques, and support circuits.

A well known semiconductor integrated circuit process is the self-aligned silicon gate process. In this FET process, silicon gate regions (usually polysilicon) are formed prior to the formation of doped source and drain regions. Source and drain regions are known to be formed by both diffusion and ion implantation processes and are self-aligned to the gate region by virtue of the fact that the gate is utilized as the mask. This silicon gate technology, which is a polysilicon process, has been characterized by the number of layers of polysilicon conductors. Thus, there are single polysilicon (SPS), double polysilicon (DPS) and triple polysilicon (TPS) etc. processes.

In earlier versions of this technology, it was common practice for the bit line to be an elongated doped N+ region; which same region also formed the drain or source region of the one device FET memory cell. Drain and source regions are interchangeable in FETs and depend on the applied bias voltages. The bit line is electrically integral with (i.e., connected to) the doped region farthest from the capacitor. The distributed capacitance along the length of such a doped bit line is relatively high. Since the signal strength of the sense amplifier input (connected to the bit line) is a function of the transfer ratio (memory cell capacitance/bit line capacitance), a large bit line capacitance tends to reduce the useful input signal to the sense amplifier. To improve the transfer ratio, the size of the storage capacitor in the memory cell can be increased. The added space occupied by such a storage capacitor is undesirable because it reduces the number of memory cells that can be put on a semiconductor chip of a given size. Moreover, the doped bit line also has a finite resistance which together with the various capacitances including the storage capacitor adversely, affect the rised time of pulses being transfered into an out of the storage capacitor. Thus, a larger storage capacitor could result in a slower operating memory cell.

For this reason, bit lines are now commonly formed by metal conductors above the silicon surface. One example of such an arrangement is shown in Scheuerlein U.S. Pat. No 4,319,342. Another arrangement is shown in Kiyoo Itoh et al, "A High Speed 16K Bit NMOS Random Access Memory", I.E.E.E. J. Solid-State Circuits SC-11, pp.585-590, Oct. 1976. Similarly, Kiyoo Itoh et al U.S. Pat. No. 4,044,340 issued Aug. 23, 1977, shows an arrangement in which the bit lines (data lines) and word lines are located above the semiconductor surface. The Itoh patent also shows an advantageous arrangement of one device memory cells known as the folded bit line and dummy cell technique. The floded bit line technique permits the "pitch" of the bit line to be matched to the "pitch" of the sense amplifier, resulting in a saving of semiconductor space. As shown in FIG. 3 of the patent, memory cells along a column are alternately connected to true bit line $D_0$ and complementary bit line $\overline{D}_0$. Whenever one of the word lines is selected, one of the dummy word lines selects one of the two dummy bits. The selected dummy bit is always the one that is connected to the bit line opposite from the one to which the selected memory cell is connected. In this way, a differential signal is provided to the sense amplifier.

The Itoh patent arrangement has a number of disadvantages. For example, the cell illustrated in FIG. 5b has undesired capacitive coupling between metal bit line D1 and doped regions 400 and 410. Also, the arrangement appears to require a sense amplifier for each 64 bits. There is no disclosed means for increasing the bit/sense amplifier ratio without decreasing the transfer ratio.

SUMMARY OF THE INVENTION

It is a primary object of the present invention to provide an improved array of one device memory cells using a single polysilicon (SPS) technology.

Another object of this invention is to improve the differential signal output of a one device memory cell.

A still further object of this invention is to minimize the number of sense amplifiers required to sense the memory cells in the array.

These and other objects, features and advantages are achieved in part by a one-device memory cell layout in which the bit contact for each cell is physically positioned at the complementary bit line for each column. The drain (source) of the transfer device is extended to this offset bit line contact. This results in the metal to diffusion capacitance inherent in devices of this type to be advantageously utilized by contributing to the differential signal sensed or written into the cell. In another aspect, the advantageous features of this array are realized by using the aforementioned cell with a sense amplifier and dummy cell configuration that is isolatable from either or both halves of a complementary set of bit lines.

BRIEF DESCRIPTION OF THE DRAWINGS

In the accompanying drawings forming a material part of this disclosure.

DISCLOSURE OF INVENTION

For further understanding of the invention and the objects and advantages thereof, reference will be made to the following description and the accompanying drawings and to the appended claims in which the various novel features of the invention are more particularly set forth.

Figure 1:
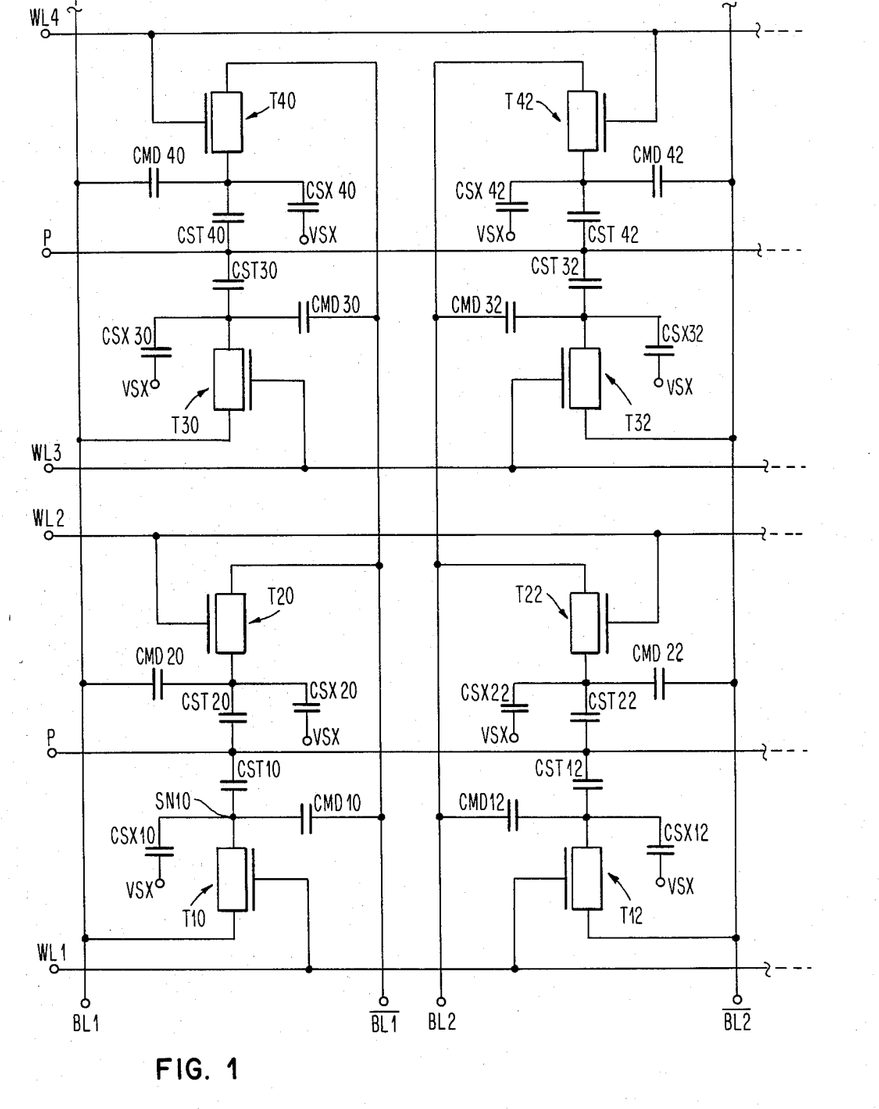
FIG. 1 is a circuit diagram illustrating a memory array of one device FET memory cells in accordance with the invention.

FIG. 1 is a circuit diagram showing a portion of a memory array. Eight memory cells with four rows of word lines and two columns of bit lines are shown in this illustration. Actually, semiconductor chips having 64,000 memory cells on a single semiconductor chip or even 256,000 cells or more are contemplated in the implementation of the present invention. Such memory chips would include support circuits such as clock generators, address buffers, decoders, sense amplifiers, latches, etc.

With continued reference to FIG. 1, a column of such memory cells is typically connected to a pair of bit lines such as BL1 and BL1 or BL2 and BL2. Also, each cell in a row is connected to a word line such as WL1, WL2, WL3, or WL4. Each cell in a row is also connected to a plate line P. Each cell includes a transfer device such as FET T10 and an associated storage capacitor such as CST10. FET T10 typically has two doped regions forming the source and drain. (Source and drain regions are interchangeable in field effect transistors and are determined by the applied operating potentials.) One of the doped regions is electrically connected by way of a bit line contact to bit line BL1. The other doped region is electrically connected to one plate of storage capacitor CST10, forming a storage node SN10. Each transfer device T10 also has a gate region connected to a word line. The gate of T10 is connected to WL1. The other plate of storage capacitor CST10 is connected to a plate line P. All plate lines can be connected together and to the highest power supply voltage VDD.

In addition to the basic elements (transfer device T10 and storage capacitor CST10 forming a one device memory cell), certain other capacitances are also present. For example, each cell has the capacitance extending from the storage node to the substrate. In the cell under discussion this is illustrated by capacitor CSX10 and the substrate has been designated as terminal VSX. Also present is a metal to diffusion capacitance CMD10 extending from the cell to the bit line BL1. This capacitor CMD10 is a significant feature of this invention as will become more apparent hereinbelow.

Each of the other seven memory cells is identical in structure to the one including transfer device T10 and storage capacitor CST10. For example, the next cell along the column including bit lines BL1 and BL1 is the cell including transfer device T20 and storage capacitor CST20. Note, however, that capacitor CMD20 is connected to bit line BL1 while the bit line contact for transfer device T20 is connected to BL1. This arrangement is opposite to that of transfer device T10 and capacitor CMD10. The next cell along the column BL1 and BL1 has the bit line contact of T30 connected to BL1 and capacitor CMD30 connected to BL1. Next, transfer device T40 has its bit line contact connected to BL1 while capacitor CMD40 is connected to BL1. In each case the gate of the transfer device is connected to its associated word line. Corresponding elements in each of the cells have been identified with corresonding reference numerals.

Subsequent columns and rows are identically arranged. For example in the column including BL2 and BL2, if the bit line contact of T12 is connected to BL2 then CMD12 is connected to BL2 (as shown). The bit line contact of T22 is connected to BL2 while capacitor CMD22 is connected to BL2. This pattern repeats itself along column line BL2/BL2 (for cells including transfer devices T32 and T42 and correspondingly identified capacitances) and continues for other columns and rows along the array.

Figure 2:
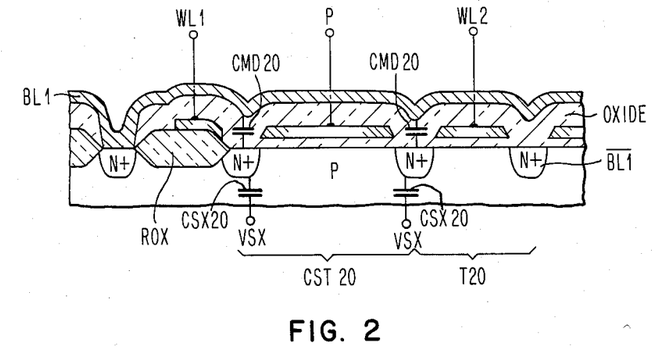
FIG. 2 is a sectional view of a portion of the array implemented in single polysilicon technology.

Refer now to FIG. 2 which is a partial sectional view of a memory cell. The cell portion illustrated in this sectional diagram is fabricated in accordance with well known single polysilicon processes. First the recessed oxide isoltion (ROX) is formed. Typically a P− channel stop diffusion (not shown) is used under the ROX. After deposition of a gate oxide, a polysilicon layer is blanket deposited. This blanket deposited polysilicon is selectively etched to delineate electrically separate areas identified in FIG. 2 as word line 1 (WL1), word line 2, (WL2), and the plate region (P). This is followed by another insulator layer over which the metal bit line BL1 is placed. The insulator is typically silicon dioxide and all insulators in this drawing have been generically identified as oxide. The substrate is usually a P type material and the N+ doped regions formed by on implantation, diffusion, or both are formed by using the polysilicon layer as a mask. In the case of the N+ contact region for the bit line, a borderless contact between the regions of recessed oxide is formed. Such borderless contacts are well known and have been described, for example, in the previously referenced Scheuerlein U.S. Pat. No. 4,319,342.

The FIG. 2 section substantially shows the FIG. 1 cell connected to word line WL2 and bit line BL1. Corresponding elements have been labeled with corresponding reference numerals. Particularly note the substrate capacitor CSX20 extending from the doped regions on either side of the storage capacitor CST20 to the substrate. The substrate terminal VSX is typically connected to a negative substrate potential such as −. to −3 volts. The plate of the storage capacitor is typically connected to VDD resulting in the attraction of N type carriers under the plate region, thereby forming the capacitor. (The plate region may also be connected to a potential slightly below VDD.) It is also known to implant impurities into the substrate under the region of the plate for particular tailoring purposes. At any rate, even though the plate and substrate terminal are connected to different DC potentials, they are both effectively at AC ground and cumulatively contribute to the capacitive value of the storage capacitor. It is a unique aspect of the present invention that the bit line to doped region capacitors CMD20 are also advantageously utilized.

It is noted that the capacitance CMD20 identified as a single capacitor in FIG. 1 actually is the sum of two capacitance extending from the bit line to the doped region on either side of the plate. This capacitance CMD20 is advantageously utilized by way of the well known Miller effect. This can be best understood by way of example. Assume that the memory cell has been set so that storage capacitor CST20 essentially stores a low potential such as 0 volts at the storage node; which is the capacitive plate in the substrate. This low voltage state is typically 0 volts while the plate is held at VDD of approximately 8.5 volts. The bit lines BL1 and BL1 are also precharged to a high voltage of 8.5 volts. Thus, when word line WL2 is brought to an up level, current flows from BL1 through the channel of T20 into storage capacitor CST20 and the two N+ doped regions on either side. This causes the voltage of the storage node and diffused regions N+ to increase. This increase of potential is coupled to bit line BL1 by capacitors CMD20, thereby increasing the voltage of BL1. The current flow from BL1 into the storage node serves to bring the potential of BL1 down. As will become more apparent, since the state of the cells is sensed by the difference in potentials between BL1 and BL1, the increasing of the potential of BL1 while decreasing the potential of BL1 results in a greater difference of potential.

Figure 3:
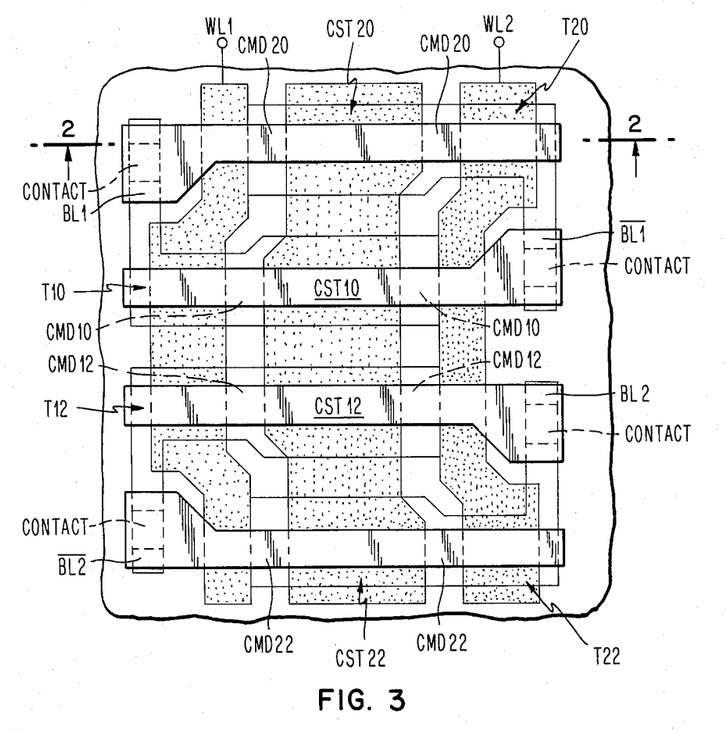
FIG. 3 is a schematic top view of a portion of the array illustrated in FIG. 1.

Refer now to FIG. 3 which is a schematic top view of a portion of the array shown in section in FIG. 2. In this top view, it becomes immediately apparent that the bit line contacts for each cell have been offset to the complementary bit line in the column. The section line 2 indication shows the portion of this top view shown in section in FIG. 2. Although bit line BL1 is located over T20 and CST20, the contact that it makes is to the contact region of T10. Similarly, bit line BL1 runs over transfer device T10 and capacitor CST10 but makes contact to the contact region of T20. The offsetting of the contacts in this manner provides advantageous utilization of the aforementioned Miller effect. This same Miller effect results in a disadvantage when a cell is arranged under the same bit line to which it makes contact, as in the prior art.

The top view of FIG. 3 also corresponds to the schematic circuit diagram of FIG. 1 including the cells having transfer devices T10, T12, T20 and T22. The same pattern of connections is extended for a large number of devices. The bit line contacts are located alternately on the true and complement bit line making contact to the transfer device in the other of the two bit lines associated with each column.

Figure 4:
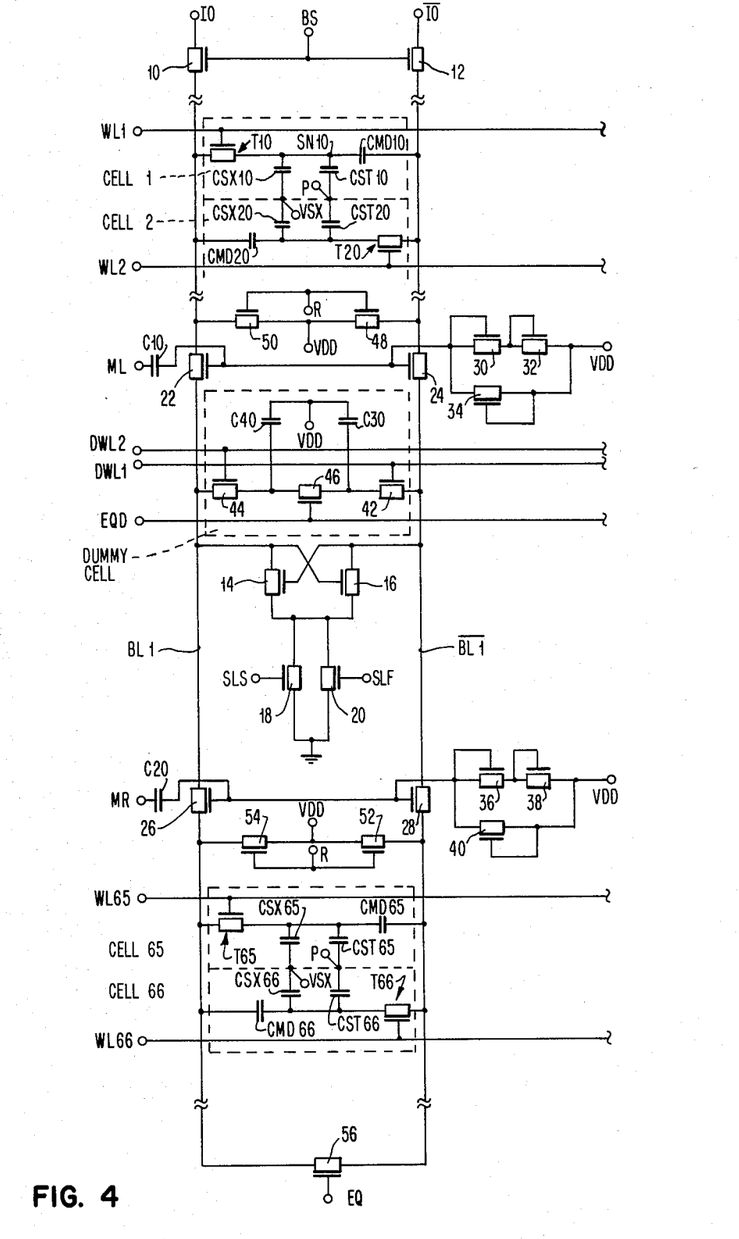
FIG. 4 is a schematic circuit diagram illustrating a portion of the support circuits.

Refer now to FIG. 4 which is a schematic circuit diagram including 128 cells along a column. The column has a pair of complementary bit lines BL1 and BL1 with the cells connected as previously described with respect to FIG. 1. Thus, cell 1 has the contact region of transfer device T10 connected to bit line BL1 while its gate region is connected to word line WL1. The storage capacitor CST10 is connected to terminal VDD. The substrate capacitor CSX10 is shown connected to terminal VSX, while the metal to diffusion capacitor CMD10 is connected to BL1, all as in FIG. 1. Similarly, cell 2 including transfer device T20, capacitor CST20, capacitor CSX20 and capacitor CMD20 are all connected as in FIG. 1.

Each column line receives data in and out by way of the input/output terminals IO and IO. When the data in this particular column is accessed, the bit switch terminal BS turns on field effect transistors 10 and 12. The contents of the selected cell along this illustrated column is sensed by the sense amplifier including transistors 14, 16, 18 and 20. This is a conventional and well known two slope sense amplifier in which the common source nodes of 14 and 16 are floating while their respective gate electrodes are conditioned to render one or the other of these transistors more conductive. Then the sense signal SLS applied to terminal SLS of transistor 18, which is a relatively small device, begins pulling the common source node down. Subsequently, the signal at terminals SLF turns on transistor 20, which is a relatively larger device rapidly completing the setting of this latching sense amplifier. (Since there is commonly a further latching sense amplifier beyond the IO terminals, this arrangement of transistors 14, 16, 18 and 20 is sometimes called a pre-amplifier.)

As previously noted, the signal provided by a one device cell is very small and a function of the transfer ratio (memory cell capacitance/bit line capacitance).

To maximize this transfer ratio, the sense amplifier in the present invention is only connected to that half of the column being sensed at any one time. In order to isolate the portion of the column not being sensed, isolation transistors 22, 24, 26, and 28 are provided. In order to isolate the upper half of the bit line (cells 1 to 64), transistors 22 and 24 are turned off. To isolate the lower half of the column (cell 65 through 128), transistors 26 and 28 are turned off.

The gate electrodes of isolation transistors 22 and 24 are controlled by a multiplex left signal input connected to terminal ML. The signal at terminal ML is coupled to the gate electrodes of 22 and 24 by capacitor C10. By means of the well known bootstrapping techinque used in field effect transistor circuits, the use of capacitor C10 permits a signal much higher than VDD to be applied to the gate electrodes of 22 and 24. In order to assure that the gate electrodes of 22 and 24 don't go more than two threshold levels above VDD, transistors 30 and 32 are provided as clamping transistors to VDD. Also, to assure that the down level of the gate of 22 and 24 does not go more than one threshold below VDD, clamping transistor 34 is provided. The lower half of the column is similarly arranged so that a multiplexing signal at terminal MR is bootstrapped to the gates of 26 and 28 by way of capacitor C20. Series diode connected transistors 36 and 38 prevent the up level from exceeding VDD by more than two thresholds; while clamping transistor 40 prevents the down level from falling more than one threshold below VDD.

The advantages of differentially sensing a pair of complementary bit lines in a column is obtained by using a dummy cell connected to the bit line opposite from the one to which the transistor being sensed is connected. Thus, dummy cell including transistor 42 and storage capacitor C30 are used when cell 1 is selected by word line 1. Similarly, the dummy cell portion including transistor 44 and capacitor C40 are used when cell 2 is accessed. Thus, when word line WL1 accesses T10, dummy word line DWL1 accesses transistor 42. When word line WL2 accesses transfer T20, dummy word line DWL2 accesses transistor 44. In this way, by means of an odd/even decoder (not shown) dummy word line DWL1 is always activated in conjunction with an odd word line dummy word line DWL2 is activated whenever an even line is selected. Field effect transistor 46 is an equalizing device which equalizes the charge in the two halves of the dummy cell after one of capacitors C30 or C40 have been charged to a binary 1 level while the other one of the two capacitors have been set to a binary 0 level. Another noteworthy feature of the present invention is that a single dummy cell arrangement including the three described field effect transistors and two storage capacitors can be used for the entire column of 128 memory cells. This is made possible by the isolation transistors 22, 24, 26, and 28.

The embodiment illustrated in FIG. 4 also has means for precharging and equalizing the true and complementary bit lines. Field effect transistors 48 and 50 are connected in series between bit line BL1 and BL1 and have their common connection connected to VDD. A precharge pulse applied at terminal R applies a potential of VDD to each of the complementary bit lines connected to cells 1 to 64. Field effect transistors 52 and 54 are similarly connected and serve the identical function for the complementary bit lines connected to cells 65 to 128. Lastly, field effect transistor 56 is connected across the complementary bit lines. At the occurrence of an equalizing pulse at the gate terminal EQ of transistor 56, the potential of the two complementary bit lines is precisely equalized.

OPERATION

Figure 5:
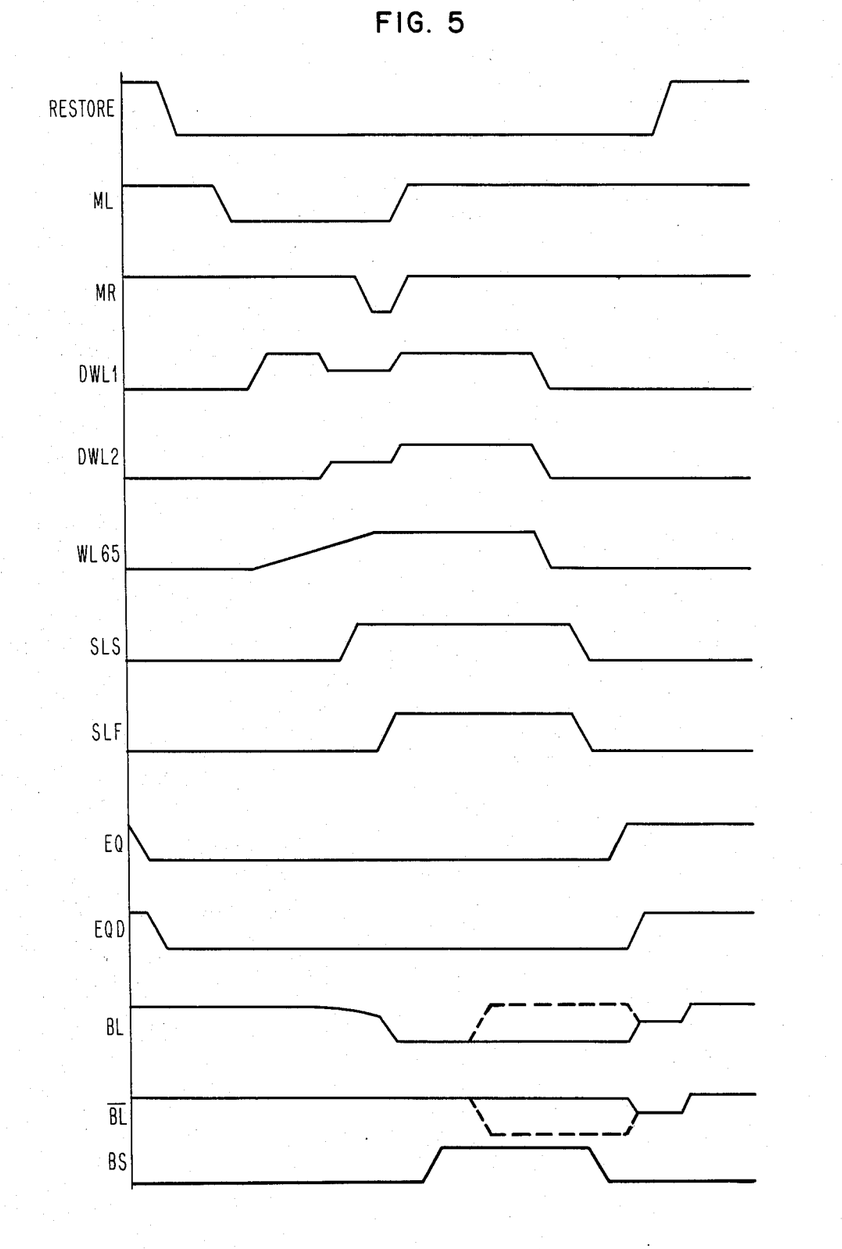
FIG. 5 is a wave form diagram illustrating the operation of the circuit of FIG. 4.

The operation of the overall system is best understood by continued reference to FIG. 4 and also to the waveform diagrams shown in FIG. 5. For a description of the operation of the cells, per se, reference should also be made to FIG. 1. The waveform diagrams describe the various waveforms that are applied to the various terminals of the FIG. 4 circuit. The actual decoders and drivers supplying these waveforms at the indicated times are well known to those skilled in the art and are therefore not separately shown.

As seen in the waveform diagram in FIG. 5, the restore pulse is initially up so that transistors receiving said signal at terminal R, i.e., transistors 48, 50, 52, and 54 are on. Also on is transistor 56 which receives the equalizing pulse at terminal EQ. The restore pulse ends slightly ahead of the EQ pulse since it is more important that the complementary bit lines be equalized than that they be precisely at VDD. Also at an up level at this time are the multiplex left terminal ML and the multiplex right terminal MR. For this reason the gate electrodes of transistors 22, 24, 26, and 28 are at VDD plus two threshold voltage levels so that no portion of the bit line is isolated from any other portion of the bit line.

At this point it is first assumed that cell 65 will be accessed. For this reason, terminal ML is brought to ground thereby bringing the gate of isolation devices 22 and 24 to one threshold voltage below VDD. This effectively isolates cells 1 through 64 from the dummy cell and the sense amplifier. To further prepare for the reading of information from cell 65, the delayed equalizing signal EQD is brought to a down level turning off transistor 46. At this point in time, the word lined decoder accesses word line WL65 to bring it to an up level. Such word lines typically have a high capacitance and for this reason the waveform is shown as having a relatively slow rise time. At the same time, the odd-/even decoder selects dummy word line DWL1 to begin turning on transistor 42.

For purposes of this example, assume that a binary 0 was stored in capacitor CST65. Thus, the storage node (node between T65 and CST65) is near 0 volts. The storage node of the dummy cell is always approximately half way between 0 volts and VDD by virtue of the equalization provided by transistor 46. Thus, as T65 is urged into conduction, current flows into the storage node bringing bit line BL1 down. Similarly, transistor 42 is turned on transferring the dummy cell's half charge onto its bit line BL1, setting BL1 to a reference potential level. In other words, transistor 42 being on causes a relatively small drop in BL1 while word line WL65 turning transfer device T65 on causes a relatively larger drop on bit line BL1 bringing BL1 to a lower potential than BL1. This voltage difference must be sufficient to be sensed by the sense amplifier.

In accordance with the present invention, sensing is improved with several additional features. As shown in the waveform diagram of FIG. 5, when the word line WL65 has been brought to a full up level, both dummy word line DWL1 and dummy word line DWL2 are brought to a potential equal to one-half VDD. This not only keeps both 42 and 44 off but also assures that the reference cell node and noise coupling onto the sense amplifier nodes are balanced. The symmetrical nature of the layout assists in the balancing of noise.

At this point in time, the gate of transistor 16 is at a slightly lower potential than the gate of transistor 14. As small transistor 18 is turned on by the occurrence of a sense signal at terminal SLS the common source connection of 14 and 16 begins to be pulled to ground initiating the setting of the latch formed by 14 and 16. To further assist with the sensing operation, at this point in time isolation devices 26 and 28 are turned off by a down level signal applied to terminal MR thereby bringing the gates of 26 and 28 to one threshold voltage below VDD. In this way the bulk of the bit line BL1 and BL1 is completely isolated from the sense amplifier. The application of a sense signal at terminal SLF to transistor 20 then rapidly completes the setting of the latch bringing bit line BL1 to ground potential. As the latch is set, the left multiplex and right multiplex terminals ML and MR are brought to their up levels as are both dummy word lines DWL1 and DWL2.

Assuming that this particular column is to be sensed by a further sense latch, the bit switches 10 and 12 are turned on by an up level signal to terminal BS. In the present example, this will provide a down level signal at terminal IO and an up level signal at terminal IO. At this point the cycle is complete and the same pulses will be repeated for the next subsequent cycle.

Typically an additional sense latch is attached to terminals IO and IO. This assures that the full logic level is transmitted with sufficient drive to the chip output terminals. Also at this time, both dummy word line DWL1 and DWL2 are brought to an up level to pre-charge the dummy cell. This is accomplished quickly because both these lines were already at one half VDD. While the full logic difference is available on terminals BL1 and BL1, the dummy word lines DWL1 and DWL2 as well as word line WL65 are brought to a down level closing the gates of all the transfer devices.

At this point the equalizing pulse is applied at terminal EQ at the gate of transistor 56, turning it on so that the bit lines are equalized at approximately one-half VDD. Then the delayed equalizing pulse is applied at terminal EQD to the gate of 46 equalizing the charge on the two storage capacitors C30 and C40 of the dummy cell. Next, the restore pulse is brought to its up level to raise both bit lines to VDD and the cycle repeats itself. The restore pulse is brought at least one threshold voltage above VDD in order to assure that the bit lines are brought to VDD.

Writing into the cell is accomplished with the same FIG. 5 waveform pattern as described for reading, with one exception. When writing, the terminals IO and IO are brought to opposite binary voltage levels, depending on the desired data to be written. For example, IO is brought to a high voltage level while IO is brought to a low voltage level. Then, when the bit switch turns on and the desired word line is turned on, the externally applied voltage (rather than the previously stored charge voltage) controls the state of the bit lines BL1 and BL1. Assuming that the information to be written into the cell is opposite to that which was previously stored in the cell, the potential of BL1 and BL1 will be as indicated in dotted lines on the waveform diagram.

Unless new data is specifically to be written into the cell, each cell is refreshed to its prior state during a read cycle. This is accomplished by leaving the word line on and also turning the dummy word lines DWL1 and DWL2 fully on after the latch has been fully set by a signal on terminal SLF. This is accomplished with a saving of time by having previously brought the dummy word lines to approximately one-half VDD.

The advantageous effects of the present cell which includes the metal to diffusion capacitors such as CMD10 are realized during both the read and write cycles. Referring to FIG. 1, consider first the write cycle. Assume that storage node SN10 is to be charged to an up level. To accomplished this, bit line BL1 is brought to an up level, bit line BL1 is brought to a down level and word line WL1 is turned on. This will charge storage node SN10 to one threshold drop below the potential of WL1. Since WL1 is usually brought to VDD, the storage node SN10 will be charged to one threshold voltage drop below VDD. When the write cycle is completed, T10 is turned off by bringing WL1 down. Subsequently, as previously described, both bit lines are brought to VDD. When bit line BL1 is first brought to one-half VDD (when the bit lines are equalized) and then to VDD, this up-going transition of BL1 couples additional charge into sense node SN10 by way of capacitor CMD10. Conversely, when a down level voltage is to be written into a storage node such as SN10, then bit line BL1 is held down while bit line BL1 is at an up level. When BL1 is also brought to an up level after WL1 has been turned off, no additional charge is coupled into the sense node. Thus, the advantages of CMD10 are obtained while writing an up level charge into SN10 but there are no disadvantages when a down level charge is written into SN10.

The advantages of capacitor CMD10 will now be described with respect to a read operation. Assume first that storage node SN10 has a down level voltage stored therein. As previously described, both bit lines BL1 and BL1 are initially equalized at an up level. When word line WL1 is turned on, current will flow from bit line BL1 into storage node SN10 to bring bit line BL1 down. With current flowing into sense node SN10, its voltage will begin to rise and by way of the well known Miller effect, this rising potential will be coupled to BL1 by way of CMD10, raising the potential of BL1. This increases the desired difference in the potential of BL1 and BL1 during the read cycle. As with the write cycle, capacitor CMD10 provides no disadvantage when an up level voltage is stored in storage node SN10. Assuming that SN10 is storing an up level voltage when word line WL1 is turned on, no current will flow into the node. Thus, bit line BL1 will be partially discharged by way of the dummy cell to its reference level, and with BL1 being higher than BL1, the high level charge in storage node SN10 will be sensed by the sense amplifier.

While the invention has been illustrated and described with respect to a preferred embodiment, it is to be understood that it is not limited to the precise construction therein disclosed and the right is reserved to all changes and modifications coming within the scope of the invention as defined in the appended claims.

What is claimed is:

1. A memory cell comprising:
   a transfer device having a control electrode and an offset contact region, the control electrode being electrically connected to a word line, the contact region being electrically connected to a first bit line;
   a storage capacitance operatively connectable to said first bit line by selective actuation of the control electrode of said transfer device; and
   a second bit line spaced apart from said first bit line and capacitively coupled to said storage capacitance, wherein said second bit line substantially overlies said storage capacitance and said control electrode, and said first bit line substantially overlies said contact region.

2. A memory cell as in claim 1 wherein said transfer device is a field effect transistor having a drain region, a source region, and a gate electrode underlying said second bit line, the contact region being electrically integral with an extension of the drain region, the control electrode being the gate electrode of the field effect transistor.

3. A memory cell as in claim 2 wherein said storage capacitance comprises:
   a conductive plate region connected to a fixed potential, wherein said conductive plate region is arranged substantially orthogonal to said first and second bit lines and is separated from said first and second bit lines and from said semiconductor surface by a dielectric; and
   a doped region formed in said semiconductor surface bordering the region therein underlying the crossover area of said second bit line and said conductive plate region, wherein said doped region is electrically integral with said storage capacitance and is capacitively coupled to said second bit line.

4. A memory cell as in claim 3 wherein said doped region is the source region of said field effect transistor.

5. An integrated circuit electronic memory array having a plurality of memory cells arranged in an orthogonal array of rows and columns, each memory cell of said array having a storage region and a transfer device, each transfer device having an offset contact region and a gate region, said array comprising:
   a plurality of word lines arranged in rows, each of said word lines being electrically integral with the gate region of each transfer device along a row of memory cells;
   a plurality of bit line pairs arranged in columns substantially orthogonal to said word lines, each of said bit line pairs being arranged along each column of memory cells, wherein each bit line in a bit line pair overlies and electrically contacts the offset contact regions of alternate ones of said memory cells in a column, and wherein the opposite bit line in said bit line pair overlies the corresponding storage region and transfer device region of each one of said alternate ones of said memory cells; and
   capacitive means coupling each bit line in each of said bit line pairs to said alternate ones of said memory cells thereunder, wherein each memory cell is in electrical contact with one bit line of said bit line pair and is capacitively coupled to and substantially underlies the other bit line of said bit line pair.

6. An integrated circuit memory cell structure comprising:
   a semiconductor substrate doped with impurities of a first conductivity type;
   a gate oxide formed on portions of said semiconductor substrate;
   polysilicon conductors formed on portions of said gate oxide, a first one of said polysilicon conductors forming one plate of a storage capacitance, at least another one of said polysilicon conductors forming a gate electrode of a transfer device;
   first and second spaced apart doped regions formed by impurities of opposite conductivity type formed in said substrate in portions thereof substantially not masked by said polysilicon conductors;

an insulator covering said polysilicon conductors and said first and second doped regions;

a first metal bit line on said insulator overlying said first and second doped regions and said polysilicon conductors and forming a capacitance with at least one of said first and second doped regions, thereby capacitively coupling said first metal bit line to said memory cell, said first metal bit line being otherwise electrically isolated from the memory cell with which it is capacitively coupled; and a third doped region formed by impurities of said opposite conductivity type in said substrate, said third doped region contacting said second doped region and extending laterally from under said first metal bit line to under a second metal bit line, said third doped region being electrically isolated from said first bit line and electrically connected to said second bit line.

* * * * *

UNITED STATES PATENT AND TRADEMARK OFFICE
CERTIFICATE OF CORRECTION

PATENT NO. : 4,493,056
DATED : Jan. 8, 1985
INVENTOR(S) : Robert S. Mao

It is certified that error appears in the above-identified patent and that said Letters Patent is hereby corrected as shown below:

Col. 3, line 15    (second occurrence), "BL1" should be --$\overline{BL1}$-- line 15    (second occurrence), "BL2" should be --$\overline{BL2}$-- line 41    "BL1" should be --$\overline{BL1}$-- line 47    (second occurrence), "BL1" should be --$\overline{BL1}$-- line 51    "BL1" should be --$\overline{BL1}$-- line 54    "BL1" should be --$\overline{BL1}$-- line 55    "BL1" should be --$\overline{BL1}$-- line 57    (first occurrence), "BL1" should be --$\overline{BL1}$-- line 64    (first and second occurrences), "BL2" should be --$\overline{BL2}$-- line 67    "BL2" should be --$\overline{BL2}$-- line 68    (second occurrence), "BL2" should be --$\overline{BL2}$--

UNITED STATES PATENT AND TRADEMARK OFFICE
CERTIFICATE OF CORRECTION

PATENT NO. : 4,493,056

DATED : Jan. 8, 1985

INVENTOR(S) : Robert S. Mao

It is certified that error appears in the above-identified patent and that said Letters Patent is hereby corrected as shown below:

Col. 4, line 28    "BL1" should be --$\overline{BL1}$-- line 51    "capacitance" should be --capacitances-- line 60    (second occurrence), "BL1" should be --$\overline{BL1}$-- line 63    "BL1" should be --$\overline{BL1}$--

Col. 5, line 1    "BL1" should be --$\overline{BL1}$-- line 2    "BL1" should be --$\overline{BL1}$-- line 4    (first occurrence), "BL1" should be --$\overline{BL1}$-- line 5    "BL1" should be --$\overline{BL1}$-- line 16    "BL1" should be --$\overline{BL1}$-- line 34    (second occurrence), "BL1" should be --$\overline{BL1}$-- line 47    (second occurrence), IO should be --$\overline{IO}$--

Col. 6, line 60    (second occurrence), BL1 should be --$\overline{BL1}$--

UNITED STATES PATENT AND TRADEMARK OFFICE
CERTIFICATE OF CORRECTION

PATENT NO. : 4,493,056
DATED : Jan. 8, 1985
INVENTOR(S) : Robert S. Mao

It is certified that error appears in the above-identified patent and that said Letters Patent is hereby corrected as shown below:

Col. 7, line 54 (both occurrences), "BL1" should be --$\overline{BL1}$-- line 56 "BL1" should be --$\overline{BL1}$-- line 59 "BL1" should be --$\overline{BL1}$--

Col. 8, line 14 (second occurrence), "BL1" should be --$\overline{BL1}$-- line 25 (second occurrence), "IO" should be --$\overline{IO}$-- line 29 (second occurrence), "IO" should be --$\overline{IO}$-- line 36 (second occurrence), "BL1" should be --$\overline{BL1}$-- line 52 (second occurrence), "IO" should be --$\overline{IO}$-- line 55 "IO" should be --$\overline{IO}$-- line 60 "BL1" should be --$\overline{BL1}$-- line 62 (second occurrence), "BL1" should be --$\overline{BL1}$--

Col. 9, line 10 "BL1" should be --$\overline{BL1}$-- line 18 "BL1" should be --$\overline{BL1}$--

UNITED STATES PATENT AND TRADEMARK OFFICE
CERTIFICATE OF CORRECTION

PATENT NO. : 4,493,056

DATED : Jan. 8, 1985

INVENTOR(S) : Robert S. Mao

It is certified that error appears in the above-identified patent and that said Letters Patent is hereby corrected as shown below:

Col. 9, line 20    "BL1" should be --$\overline{BL1}$-- line 24    (second occurrence), "BL1 should be --$\overline{BL1}$-- line 34    "BL1" should be --$\overline{BL1}$-- line 41    "BL1" should be --$\overline{BL1}$-- line 42    "BL1" should be --$\overline{BL1}$-- line 44    "BL1" should be --$\overline{BL1}$-- line 49    "BL1" should be --$\overline{BL1}$-- line 51    (second occurrence), "BL1" should be --$\overline{BL1}$--

Signed and Sealed this

Fifteenth Day of October 1985

[SEAL]

Attest:

DONALD J. QUIGG

Attesting Officer

Commissioner of Patents and Trademarks—Designate